(12) United States Patent
Bergmann

(10) Patent No.: US 9,070,665 B2
(45) Date of Patent: Jun. 30, 2015

(54) HIGH-VOLTAGE SWITCH WITH A COOLING DEVICE

(71) Applicant: Bergmann Messgeraete Entwicklung KG, Murnau (DE)

(72) Inventor: Thorald Horst Bergmann, Murnau (DE)

(73) Assignee: Bergmann Messgeraete Entwicklung KG, Murnau (DE)

( * ) Notice: Subject to any disclaimer, the term of this patent is extended or adjusted under 35 U.S.C. 154(b) by 119 days.

(21) Appl. No.: 13/886,606

(22) Filed: May 3, 2013

(65) Prior Publication Data

US 2013/0313701 A1 Nov. 28, 2013

Related U.S. Application Data

(63) Continuation of application No. PCT/DE2010/075118, filed on Nov. 3, 2010.

(51) Int. Cl.
| | | |
|---|---|---|
| H01L 23/34 | (2006.01) | |
| H01L 23/46 | (2006.01) | |
| H01L 23/373 | (2006.01) | |
| H01L 23/473 | (2006.01) | |
| H05K 7/20 | (2006.01) | |
| H01L 23/15 | (2006.01) | |

(52) U.S. Cl.
CPC ............... *H01L 23/46* (2013.01); *H01L 23/15* (2013.01); *H01L 23/3735* (2013.01); *H01L 23/473* (2013.01); *H05K 7/20254* (2013.01); *H01L 2924/0002* (2013.01)

(58) Field of Classification Search
None
See application file for complete search history.

(56) References Cited

U.S. PATENT DOCUMENTS

| 4,644,294 A * | 2/1987 | Palara et al. ............... 330/298 |
| 5,790,574 A * | 8/1998 | Rieger et al. ............... 372/25 |
| 5,802,087 A | 9/1998 | Takaichi |
| 6,411,063 B1 * | 6/2002 | Kouzu et al. ............... 320/150 |
| 7,016,192 B2 * | 3/2006 | Beihoff et al. ............ 361/689 |
| 2009/0116519 A1 * | 5/2009 | Redford ............... 372/29.014 |

FOREIGN PATENT DOCUMENTS

| DE | 3908996 | 9/1990 |
| DE | 4017749 | 12/1991 |
| EP | 0 844 812 | * 11/1997 |
| EP | 0844812 | 5/1998 |
| JP | 2010212561 | 9/2010 |

OTHER PUBLICATIONS

Machine translation, (hereinafter, Dubelloy).*
International Search Report cited in PCT Application No. PCT/DE2010/075118 dated Dec. 12, 2011.

* cited by examiner

*Primary Examiner* — Yasser A Abdelaziez
(74) *Attorney, Agent, or Firm* — Cooper Legal Group, LLC

(57) ABSTRACT

A high-voltage switch comprises one or more high-voltage transistors and a cooling substrate which may be manufactured from an electrically insulating material and on and/or through which a cooling medium can flow, wherein the one or more high-voltage transistors are mounted on at least one surface of the cooling substrate.

20 Claims, 3 Drawing Sheets

HIGH-VOLTAGE SWITCH WITH A COOLING DEVICE

RELATED APPLICATION

This application corresponds to International Patent Application PCT/DE2010/075118, filed on Nov. 3, 2010, at least some of which may be incorporated herein.

SUMMARY

The disclosed subject matter relates to a high-voltage switch with a cooling device and a Pockels cell drive circuit and a laser beam source.

For switching laser pulses, use is made of optical switches or modulators, which can be arranged either within or outside the laser resonator in the beam path. In the case of the optical modulators, a distinction is made, in principle, between electro-optical modulators and acousto-optical modulators. One important parameter when using optical modulators is an achievable switching time. In the case of acousto-optical modulators, the achievable switching time is limited by the speed of sound and a laser beam diameter, such that in some cases one or more switching edges of acousto-optical modulators are too slow to effectively suppress, for example, preceding or succeeding pulses at a short distance from a main pulse. By contrast, in the recent past, electro-optical modulators have been developed further in the direction of higher clock rates, such that they would be able to replace acousto-optical modulators in specific laser applications, since they are distinguished by significantly shorter, electronically governed switching edges.

As a result, electro-optical modulators are constructed such that they comprise a Pockels cell as the actual optical switching element having variable optical properties and a polarization-selective element such as, for example, a reflective analyzer having invariable optical properties. A Pockels cell may comprise a birefringent crystal which is aligned in a suitable manner with an incident monochromatic and polarized light beam and to which an electrical voltage of the order of magnitude of a few hundred V to a few kilovolts is applied. In conjunction with a polarization-dependent optical element, the Pockels cell can, in a manner dependent on the electrical voltage applied to it, (a) switch a light on or off, or
(b) direct the light on two different paths through an optical system.

By means of a suitable switchable high-voltage supply, the Pockels cell can be switched back and forth between two states, in which a laser beam emerging from the Pockels cell is linearly polarized with polarization directions that are respectively perpendicular to one another. The voltage required to achieve the two states respectively mentioned is a function of the crystal parameters and a used wavelength of the light to be switched. There are applications of Pockels cells in which the latter have to be switched on and off rapidly, wherein both transition times have to be in the range of a few nanoseconds. In some applications, merely one of said transition times has to be short, either the switching-on or the switching-off, wherein the respective other transition time can be in the range of microseconds.

Such an electro-optical modulator, constructed from a Pockels cell and a suitable switchable high-voltage supply, can be used, for example, for optically switching short laser pulses having a duration of a few nanoseconds (ns) or ultrashort laser pulses having a picosecond (ps) or femtosecond (fs) duration for changing the intensity or the beam direction of the laser pulses. Such ultrashort laser pulses are generated by the method of mode locking. Therefore, laser beam sources for ultrashort pulses fundamentally may have very high repetition rates (greater than megahertz (MHz), typically 40-200 MHz for solid-state lasers) and low pulse energies (in the nanojoule range, typically 0.1-50 nJ). If individual pulses or pulse groups of ps or fs laser pulses are required, then a Pockels cell may be used to select these pulses. In this case, firstly, between two pulses, which the laser beam source typically emits with a temporal spacing of 5-25 ns, the voltage has to be completely switched on so as to be completely switched off again after transmission of a single laser pulse 5-25 ns later.

One general aim is to constantly increase the maximum possible repetition rate of the Pockels cell in order to increase the rate at which pulses or pulse groups can be selected by the Pockels cell. The maximum repetition rate of the Pockels cell is essentially determined by the maximum repetition rate with which the high-voltage switch that drives the Pockels cell can be operated.

A high-voltage switch is connected to a cooling device and comprises one or more high-voltage transistors and a cooling substrate, which is produced from an electrically insulating material and on or through which a cooling medium can flow, wherein the high-voltage transistor or high-voltage transistors are mounted on at least one surface of the cooling substrate.

The high-voltage transistors used can be, in principle, any desired switchable transistors having any desired dielectric strengths, such as, for example, MOSFETs, bipolar transistors, etc. The dielectric strength can be, for example, 100 V or more, but transistors having dielectric strengths of 500 V or more may be preferable.

The maximum possible repetition rate of a high-voltage switch is determined, inter alia, by the maximum possible consumption of electrical power at the high-voltage switch and the heat that is correspondingly to be dissipated. To a first approximation, for this purpose, the following formula holds true:

$$P = f_{REP} \times (a \times U^2 + b) \quad (1)$$

where P is the consumed electrical power, $f_{REP}$ is the repetition rate, U is the applied high voltage and a and b are constants.

The high-voltage switch has the advantage, then, that a very efficient heat dissipation is made possible since the heat merely has to flow through a wall of the cooling plate as far as the flowing cooling medium. A further advantage of the high-voltage switch is that, on account of the electrically insulating material of the cooling plate, little or no appreciable parasitic capacitances are formed, and so little or no losses as a result of charging and discharging of the capacitances need be feared in this regard.

In one case, the cooling substrate can be by a plate which is produced from the electrically insulating material and on which the cooling medium flows. However, one embodiment consists in the cooling substrate being at least partly formed by a hollow body, through which the cooling medium flows. In this case, the walls of the hollow body are produced from the electrically insulating material and an inlet opening for the cooling medium is shaped into one wall and an outlet opening for the cooling medium is shaped into the same wall or another wall.

In accordance with one embodiment of the high-voltage switch, the electrically insulating material of the cooling substrate comprises a ceramic material or consists thereof. In particular, in this case, the ceramic material comprises the compound aluminum nitride (AlN) or consists thereof. As is known, the ceramic material aluminum nitride has a high thermal conductivity of approximately 180 W/mK.

In accordance with one embodiment, the electrically insulating material of the cooling substrate comprises any other ceramic material desired or any desired nonmetallic material or consists of these materials mentioned, wherein preferably the thermal conductivity of the ceramic material or of the nonmetallic material is greater than 50 W/mK, greater than 100 W/mK, and/or greater than 150 W/mK.

In accordance with one embodiment of the high-voltage switch, the high-voltage transistors respectively have a planar cooling area and are applied with their cooling area directly areally on the planar surface of the cooling substrate. In this way, it is possible to ensure an optimum heat transfer between the high-voltage transistors and the cooling substrate.

In accordance with one embodiment of the high-voltage switch, one portion of the high-voltage transistors is mounted on a first surface of the cooling substrate and another, in particular remaining, portion of the high-voltage transistors is mounted on a second surface of the cooling substrate, wherein the first surface and the second surface lie in different planes. The first surface and the second surface of the cooling substrate can be arranged, in particular, in a manner situated opposite one another and in mutually parallel planes. Furthermore, half of the high-voltage transistors can be mounted on the first surface and the other half of the high-voltage transistors can be mounted on the second surface.

In accordance with one embodiment of the high-voltage switch, the high-voltage transistors are interconnected to form a push-pull circuit. In this case, first high-voltage transistors can be connected in series between a first pole of a voltage source and a node, and the second high-voltage transistors can be connected in series between a second pole of the voltage source and the node. In this case, it can be provided that the first high-voltage transistors are mounted on a first surface of the cooling substrate and the second high-voltage transistors are mounted on a second surface of the cooling substrate and the first surface and the second surface are situated opposite one another and are arranged in mutually parallel planes.

In accordance with another embodiment of the high-voltage switch, the high-voltage transistors are interconnected to form a bridge circuit, in particular to form a bridge circuit having an H configuration. In this embodiment, it can be provided that half of the high-voltage transistors may be mounted on a first surface of the cooling substrate and half of the high-voltage transistors may be mounted on a second surface of the cooling substrate.

The described manner of mounting the high-voltage transistors in equal halves on two opposite sides of the cooling substrate may be advantageous since, firstly, the cooling capacity provided is utilized efficiently and, second, a space-saving arrangement of the high-voltage transistors is made possible.

A high-voltage switch according to the disclosure can further comprise a number of charging/discharging circuits corresponding to the number of high-voltage transistors, where the respective circuits are connected to one high-voltage transistor of the one or more high-voltage transistors. In one exemplary embodiment, the charging/discharging circuits are likewise applied on the cooling substrate, wherein respective charging/discharging circuits can be arranged in spatial proximity to the high-voltage transistor assigned to it. As an alternative thereto, however, the charging/discharging circuits can also be arranged outside the cooling substrate, for instance on a circuit board connected to the cooling substrate.

The present disclosure likewise relates to the use of a high-voltage switch according to the disclosure in a Pockels cell drive circuit and to the use of a correspondingly driven Pockels cell as a pulse selector in conjunction with a laser beam source. In this case, the Pockels cell can optionally be arranged in the laser resonator or else outside the laser resonator.

DESCRIPTION OF THE DRAWINGS

Exemplary embodiments of the disclosure are explained in greater detail below with reference to the drawings, in which.

DETAILED DESCRIPTION

Insofar as the disclosed subject matter, the claimed subject matter or the drawings express the fact that circuit elements are "connected", "electrically connected" or "coupled" to one another, this can mean that the elements mentioned are coupled to one another directly, that is to say without one or more other elements situated in between. However, it can also mean that the elements mentioned are coupled to one another indirectly and that one or more other elements are coupled between the elements mentioned.

Insofar as identical reference signs are used in the figures, they refer to identical or functionally identical elements, and so the description of these elements is not repeated in these cases.

Figure 1A:
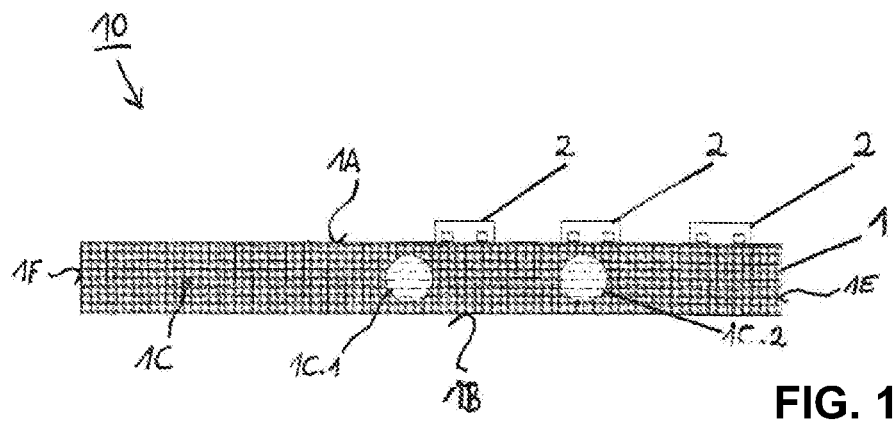
FIG. 1A illustrates a high-voltage switch in accordance with one embodiment in a lateral cross-sectional view.
Figure 1B:
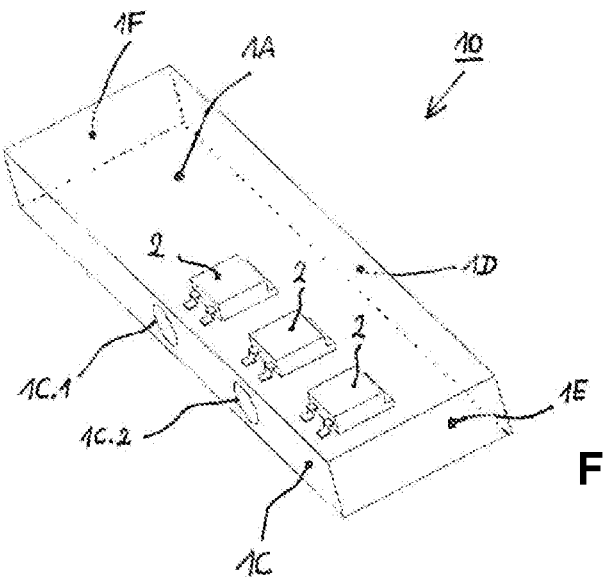
FIG. 1B illustrates a high-voltage switch in accordance with one embodiment in a perspective view.

FIG. 1A shows a high-voltage switch in accordance with one embodiment in a lateral cross-sectional view, and FIG. 1B shows a high-voltage switch in accordance with one embodiment in a perspective view. The high-voltage switch 10 substantially comprises a cooling substrate 1 and a number of high-voltage transistors 2 arranged on a main surface 1A of the cooling substrate 1. The cooling substrate 1 is embodied in the form of a parallel-epipedal hollow body and thus has two large main surfaces 1A and 1B, longitudinal side faces 1C and 1D and transverse side faces 1E and 1F. The cooling substrate 1 is produced by the ceramic material aluminum nitride (AlN) and may have a thermal conductivity of approximately 180 W/mK.

In a longitudinal side face 1C, the cooling substrate 1 has an inlet opening 1C.1 and an outlet opening 1C.2, through which a cooling medium such as water can flow into and out of the interior of the hollow body of the cooling substrate 1 formed by the walls 1A-1F. Instead of being shaped into the longitudinal wall 1C, the inlet and outlet openings 1C.1 and 1C.2 can alternatively also be shaped into a transverse wall 1E or 1F or else, under one or more circumstances, into one of the walls 1A or 1B of the cooling substrate 1. The inlet and outlet openings can also be shaped into different walls of the cooling substrate 1. The high-voltage transistors 2 are of identical design and respectively have a lower planar cooling area with which they are directly applied areally on the first main surface 1A of the cooling substrate 1. The heat produced by the high-voltage transistors 2 owing to the consumption of electrical power thus merely has to be transported through this wall of the highly thermally conductive ceramic material AlN to the cooling medium.

Figure 2A:
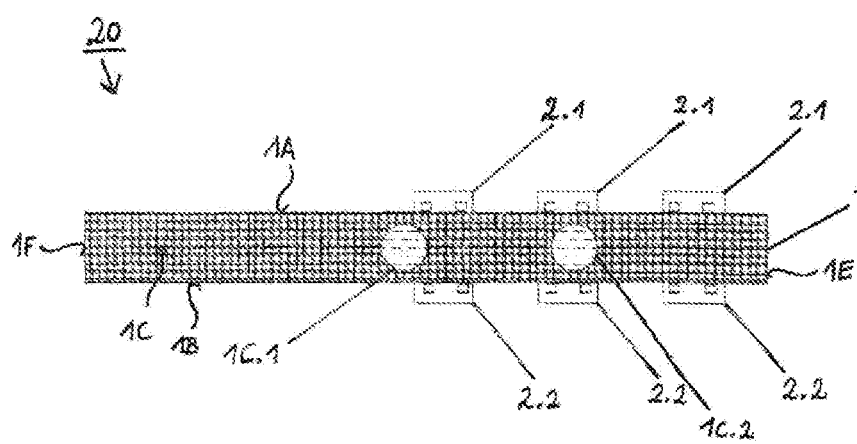
FIG. 2A illustrates a high-voltage switch in accordance with one embodiment in a lateral cross-sectional view.
Figure 2B:
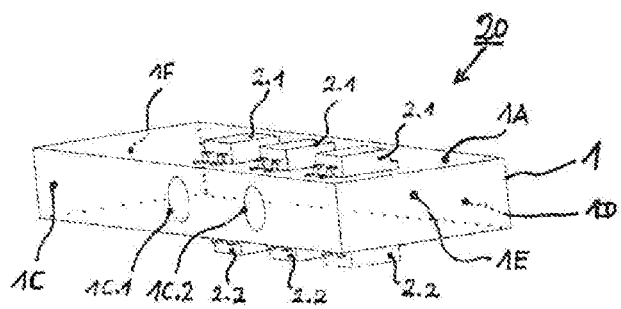
FIG. 2B illustrates a high-voltage switch in accordance with one embodiment in a perspective view.

FIG. 2A schematically illustrates a high-voltage switch in accordance with one embodiment in a lateral cross-sectional view and FIG. 2B schematically illustrates a high-voltage switch in accordance with one embodiment in a perspective view. The high-voltage switch 20 comprises a cooling substrate 1, which, in terms of construction and functionality, may be embodied similarly and/or identically to the cooling substrate 1 of the exemplary embodiment in FIG. 1A and/or FIG. 1B and so the details need not be repeated here. The high-voltage switch 20 further comprises first high-voltage transistors 2.1 and second high-voltage transistors 2.2. The first high-voltage transistors 2.1 are applied on a first main surface 1A of the cooling substrate 1 and the second high-voltage transistors 2.2 are applied on a second main surface 1B of the cooling substrate 1. As can be seen in the lateral cross-sectional view of FIG. 2A, the first and second high-voltage transistors 2.1 and 2.2 are applied in a manner situated directly opposite one another in pairs on the first and second main surfaces 1A and 1B of the cooling substrate 1. This will be of further significance in a different context further below.

Figure 3:
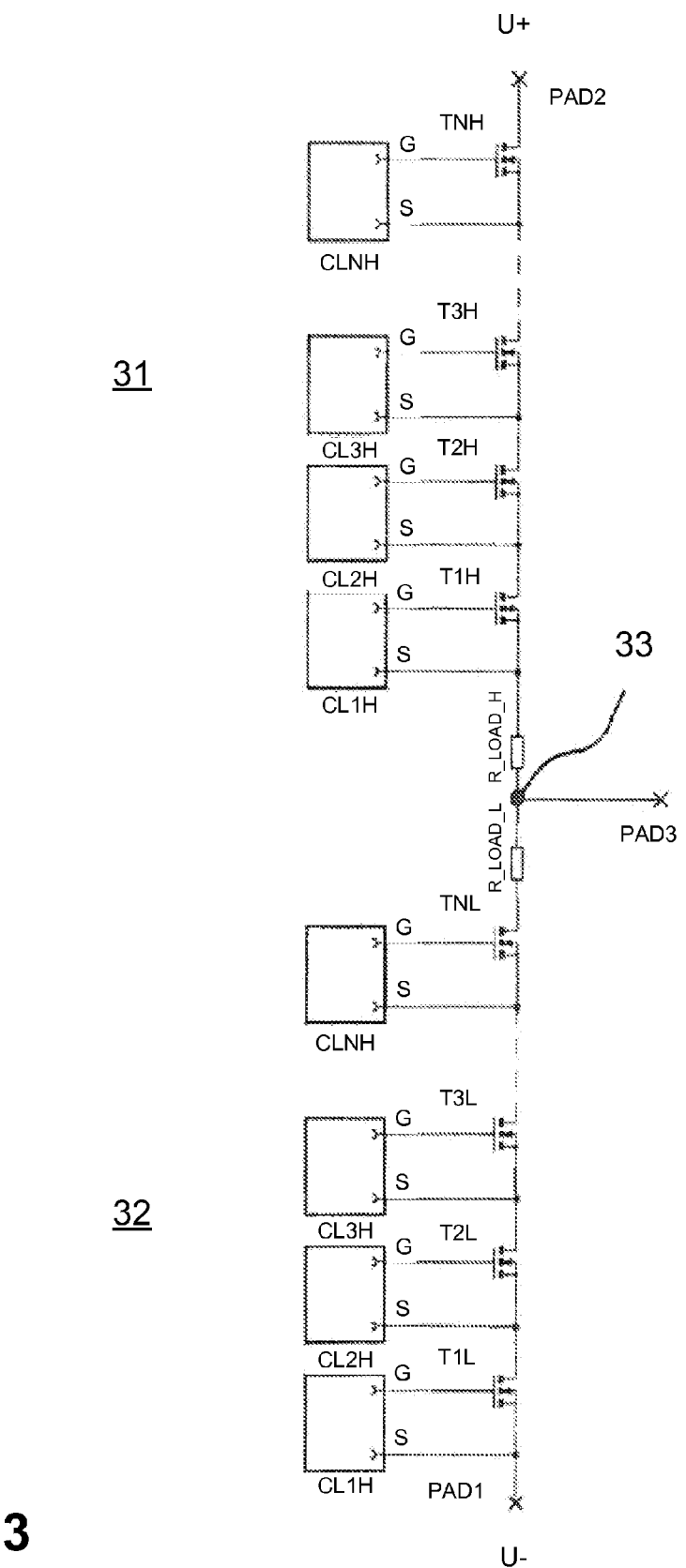
FIG. 3 illustrates a circuit diagram of a high-voltage switch in the embodiment of a push-pull circuit.

FIG. 3 schematically illustrates a circuit diagram of a high-voltage switch in accordance with one embodiment. The high-voltage switch 30 in FIG. 3 is embodied as a push-pull circuit, which is connected between a first potential connection U+ and a second potential connection U−, wherein the first potential connection and the second potential connection are connected to the connection terminals of a high-voltage source. The high-voltage switch 30 substantially comprises two transistor chains 31 and 32 comprising respectively MOS field effect transistors (MOSFETs) T1H-TNH and T1L-TNL, which are respectively connected in series with regard to their source/drain paths. The MOSFETs T1H-TNH and T1L-TNL are driven by charging/discharging circuits CL1H-CLNH and CL1L-CLNL known per se, which are respectively connected to the gate and source connections of the MOSFETs T1H-TNH and T1L-TNL.

The high-voltage switch 30 comprises a first transistor chain 31, within which first MOSFET transistors T1H-TNH are connected in series. The drain connection of the MOSFET transistor TNH is connected to the first voltage pole U+ of the high-voltage source, while at the other end of the transistor chain the MOSFET transistor T1H is connected by its source connection to a resistor $R_{LOAD\_H}$, which, for its part, is connected to a node 33. The high-voltage switch 30 further comprises a second transistor chain 32 in which the MOSFET transistors T1L-TNL are connected in series. The MOSFET transistor T1L is connected by its source connection to the second voltage pole U− of the high-voltage source, while the MOSFET transistor TNL is connected by its drain connection to a resistor $R_{LOAD\_L}$, which is connected to the node 33. The resistors $R_{LOAD\_L}$ and $R_{LOAD\_R}$ should be understood merely as an example and may not be mandatory. Therefore, they can also be omitted. However, in addition to the resistors $R_{LOAD\_L}$ and $R_{LOAD\_R}$, it is also possible to insert one or more other resistors between the node 33 and the connection point PAD3.

According to the disclosed subject matter, the MOSFETs T1H-TNH and T1L-TNL of the transistor chains 31 and 32 are mounted on a cooling substrate 1 in accordance with at least one of the embodiments in FIG. 1A, FIG. 1B, FIG. 2A and/or FIG. 2B. One preferred variant can be formed by the fact that, in accordance with the embodiment in FIG. 2A and/or FIG. 2B, the transistors T1H-TNH of the first transistor chain 31 are mounted on a first surface 1A of the cooling substrate 1 and the transistors T1L-TNL of the second transistor chain 32 are mounted on a second surface 1B of the cooling substrate 1, said second surface being situated opposite the first surface 1A. A particularly advantageous construction arises here if those transistors of the two transistor chains which spatially and in terms of potential are equally spaced apart from their associated voltage pole U+ or U− are arranged opposite one another in pairs. Thus, the transistor T1L may be arranged opposite the transistor TNH, the transistor T2L may be arranged opposite T(N−1)H, etc. This may be advantageous since, during the operation of a push-pull circuit, during a switching process the transistors of one transistor chain are closed, while at the same time the transistors of the other transistor chain are opened. During such a switching process, potential changes of identical or similar amplitude then arise in the transistors at the output side thereof, thus resulting in particularly low capacitive charge reversals and correspondingly low electrical losses.

The charging/discharging circuits CL1H-CLNH and CL1L-CLNL are likewise mounted on the cooling substrate 1 in one preferred embodiment. They are mounted on the surface 1A of the cooling substrate 1 in the form of a series in such a way that respective charging/discharging circuits become situated directly alongside the high-voltage transistor assigned to it. The electrical connections on the cooling substrate 1 can be produced by any desired techniques known per se. Mention may be made here of the DCB technique (direct copper bonding) and the AMB technique (active metal brazing). Likewise, there are techniques known per se which are used to apply or integrate resistors, inductances and capacitors on ceramic substrates. By way of example, the resistors $R_{LOAD\_L}$ and $R_{LOAD\_R}$ and connection pads PAD1-PAD3 shown by way of example in FIG. 3 can be applied in this way.

The high-voltage switch shown in FIG. 3 can be used for a Pockels cell drive circuit. For this purpose the Pockels cell is connected between the node 33 (PAD3) with its first electrical connection and is connected by its second electrical connection to the second voltage pole U− of the high-voltage source.

What is claimed is:

1. A high-voltage switch with a cooling device, comprising:
    a plurality of high-voltage transistors; and
    a cooling substrate, produced from an electrically insulating material, at least one of on or through which a cooling medium can flow,
    where first high-voltage transistors of the plurality of high-voltage transistors are mounted on a first surface of the cooling substrate and second high-voltage transistors of the plurality of high-voltage transistors are mounted on a second surface of the cooling substrate, the first high-voltage transistors electrically coupled with the second high-voltage transistors, the first surface and the second surface lying in different planes.

2. The high-voltage switch of claim 1, the electrically insulating material comprising a ceramic material.

3. The high-voltage switch of claim 2, the ceramic material comprising aluminum nitride.

4. The high-voltage switch of claim 1, at least one of the plurality of high-voltage transistors comprising a cooling area and applied with the cooling area areally on the at least one surface of the cooling substrate.

5. The high-voltage switch of claim 1, the cooling substrate embodied at least partly as a hollow body, one or more walls of the hollow body produced from the electrically insulating material, an inlet opening for the cooling medium shaped into a wall and an outlet opening for the cooling medium shaped into a second wall.

6. The high-voltage switch of claim 1, the cooling substrate embodied in a parallel-epipedal manner.

7. The high-voltage switch of claim 1, the cooling substrate comprising two or more side faces connecting the first surface and the second surface.

8. The high-voltage switch of claim 1, the first surface and the second surface situated opposite one another and arranged in mutually parallel planes.

9. The high-voltage switch of claim 1, half of the plurality of high-voltage transistors mounted on the first surface and another half of the plurality of high-voltage transistors mounted on the second surface.

10. The high-voltage switch of claim 1, the plurality of high-voltage transistors interconnected to form a push-pull circuit.

11. The high-voltage switch of claim 10,
the first high-voltage transistors connected in series between a first pole of a voltage source and a node, and
the second high-voltage transistors connected in series between a second pole of the voltage source and the node.

12. The high-voltage switch of claim 1, the plurality of high-voltage transistors interconnected to form a bridge circuit.

13. The high-voltage switch of claim 1, comprising a number of charging/discharging circuits corresponding to a number of the plurality of high-voltage transistors, respective charging/discharging circuits connected to one of the plurality of high-voltage transistors.

14. The high-voltage switch of claim 13, the charging/discharging circuits at least partly applied on the cooling substrate.

15. The high-voltage switch of claim 1 used as a drive circuit for a Pockels cell.

16. The high voltage switch of claim 15, the Pockels cell used as a pulse selector in conjunction with a laser beam source, the Pockels cell arranged within or outside a laser resonator.

17. The high-voltage switch of claim 1, the cooling substrate at least partly formed by a hollow body.

18. The high-voltage switch of claim 10 used as a drive circuit for a Pockels cell.

19. A high-voltage switch, comprising:
a plurality of high-voltage transistors; and
a cooling substrate produced from an electrically insulating material, the cooling substrate comprising a first main surface, a second main surface and four side faces connecting the first main surface and the second main surface,
where first high-voltage transistors of the plurality of high-voltage transistors are mounted on the first main surface of the cooling substrate and second high-voltage transistors of the plurality of high-voltage transistors are mounted on the second main surface of the cooling substrate.

20. A Pockels cell drive circuit arrangement, comprising:
a drive circuit configured to drive a Pockels cell, the drive circuit comprising a plurality of high-voltage transistors; and
a cooling substrate comprising a first main surface and a second main surface,
where first high-voltage transistors of the plurality of high-voltage transistors are mounted on the first main surface of the cooling substrate and second high-voltage transistors of the plurality of high-voltage transistors are mounted on the second main surface of the cooling substrate.

\* \* \* \* \*